United States Patent
Akagi

(10) Patent No.: US 9,425,584 B2
(45) Date of Patent: Aug. 23, 2016

(54) LASER DRIVE DEVICE THAT DRIVES LASER DIODE, METHOD OF CONTROLLING THE SAME, AND STORAGE MEDIUM

(71) Applicant: CANON KABUSHIKI KAISHA, Tokyo (JP)

(72) Inventor: Daisuke Akagi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 37 days.

(21) Appl. No.: 14/258,059

(22) Filed: Apr. 22, 2014

(65) Prior Publication Data

US 2014/0321490 A1  Oct. 30, 2014

(30) Foreign Application Priority Data

Apr. 30, 2013  (JP) ................. 2013-095635

(51) Int. Cl.
*H01S 5/40* (2006.01)
*H01S 5/022* (2006.01)
*H01S 5/0683* (2006.01)

(52) U.S. Cl.
CPC ........... *H01S 5/4025* (2013.01); *H01S 5/02212* (2013.01); *H01S 5/06835* (2013.01)

(58) Field of Classification Search
CPC .............. H01S 5/4024; H01S 5/02212; H01S 5/06835; H01S 5/042
See application file for complete search history.

(56) References Cited

U.S. PATENT DOCUMENTS

2008/0225910 A1* 9/2008 Lerner ................. H01S 5/0683
372/29.011
2009/0016394 A1* 1/2009 Kanno ..................... B41J 2/442
372/38.02

FOREIGN PATENT DOCUMENTS

JP  11-245444 A  9/1999

* cited by examiner

*Primary Examiner* — Xinning Niu
(74) *Attorney, Agent, or Firm* — Rossi Kimms & McDowell LLP

(57) ABSTRACT

A laser drive device capable of easily reducing influence of bias light emission and thereby preventing variation in threshold current. A light amount of a laser beam emitted from a laser diode is detected by a photodiode. A drive current supplied to the laser diode is controlled according to the detected light amount to thereby control the amount of light emitted from the laser diode to a plurality of set light amounts. A threshold current is calculated according to the detected light amount and the drive current. The light amounts are changed and selected, and threshold currents calculated with respect to respective set light amounts are compared. A light amount corresponding to a difference in threshold current not less than a predetermined value is set as a set light amount for use in light amount control of the laser diode.

5 Claims, 14 Drawing Sheets

*FIG. 5*

| APC SIGNAL | VIDEO MODE SIGNAL | BEAM SELECTION SIGNAL | CURRENT CONTROLLER | CURRENT DRIVE SECTION |
|---|---|---|---|---|
| H | L | LDa | APC | FORCIBLY OUTPUT FROM LDa |
| | | LDb | | FORCIBLY OUTPUT FROM LDb |
| L | H | LDa | HOLD CURRENT VALUES | VIDEO MODE |
| | | LDb | | |
| H | H | LDa | HOLD CURRENT VALUES | FORCIBLY TURN OFF |
| | | LDb | | |
| L | L | LDa | INITIALIZE CURRENT VALUES | FORCIBLY TURN OFF |
| | | LDb | | |

FIG. 7

| GAIN SWITCHING SIGNAL | | | GAIN |
|---|---|---|---|
| 0 | 0 | 0 | ×1 |
| 0 | 0 | 1 | ×2 |
| 0 | 1 | 0 | ×3 |
| 0 | 1 | 1 | ×4 |
| 1 | 0 | 0 | ×5 |
| 1 | 0 | 1 | ×6 |
| 1 | 1 | 0 | ×7 |
| 1 | 1 | 1 | ×8 |

LASER DRIVE DEVICE THAT DRIVES LASER DIODE, METHOD OF CONTROLLING THE SAME, AND STORAGE MEDIUM

BACKGROUND OF THE INVENTION

1. Field of the Invention

The present invention relates to a laser drive device, a method of controlling the same, and a storage medium, and more particularly to a laser drive device used for an exposure device of an image forming apparatus, such as a printer.

2. Description of the Related Art

In an image forming apparatus or the like using an electrophotographic process, a laser diode is generally used as a light emitting element so as to convert electric signal pulses to optical pulses. Further, the laser diode is required to emit a desired amount of light even when the temperature of the laser diode changes.

However, light emission characteristics of the laser diode are largely dependent on the temperature of the laser diode, and a threshold current varies with changes in the temperature of the laser diode. In the laser diode, a light emitting delay occurs as a phenomenon specific to the laser diode. To improve emission responsiveness of the laser diode during light emission, a bias current is supplied to the laser diode when light is not emitted during image formation. Further, to improve the emission responsiveness, it is preferable that the bias current as close to the threshold current as possible is supplied to the laser diode.

However, as mentioned above, the threshold current is largely dependent on the temperature of the laser diode and is different between individual laser diodes, and hence if the bias current supplied to the laser diode is set to a fixed value, the emission responsiveness can be lowered, and further, a laser beam may be emitted with such a light amount as will change the surface potential of a photosensitive member.

By the way, there has been proposed a laser drive device for use in an image forming apparatus, which is configured to determine a bias current supplied to a laser diode according to two light amounts of laser light emission and drive currents corresponding to the light amounts (bias APC (Automatic Power Control): see e.g. Japanese Patent Laid-Open Publication No. H11-245444).

If the conventional bias current control method is used in an apparatus that exposes a photosensitive member with a plurality of laser beams emitted from a plurality of light emitting elements so as to increase the speed of image formation, there occurs a problem that the bias current cannot be set with high accuracy. When determining a value of the bias current, drive currents are supplied to the light emitting elements which are objects to be controlled, so as to cause the light emitting elements to emit respective two amounts of light: a first light amount P1 (APC_H) and a second light amount P2 (APC_L).

In doing this, the drive current is controlled while detecting the light amount using a detection device, such as a PD (photodiode), and there are sampled a drive current flowing when the first light amount is detected and a drive current flowing when the second light amount is detected. Based on these results, light emission characteristics in a laser oscillation region of the light emitting elements to be controlled are determined. Then, a threshold current is calculated based on the light emission characteristics, and the bias current is determined based on the threshold current.

When one light emitting element is under APC, the bias current continues to be supplied to the other light emitting elements than the one light emitting element under APC, so as to secure the emission responsiveness thereof. The above-mentioned PD is commonly used for the plurality of light emitting elements, and is arranged in the vicinity of the plurality of light emitting elements. Therefore, the supply of the bias current causes spontaneous emission of laser beams from the light emitting elements, and the spontaneously emitted laser beams enter the PD. Therefore, the detection result from the PD includes light amounts of laser beams emitted from the other light emitting elements than the one under APC.

When determining the threshold current based on the two light amounts and the drive currents corresponding to these light amounts as mentioned above, it is necessary, for accurate calculation of the threshold current, that one of the two light amounts (hereinafter referred to as APC_H) is set to a target light emission amount and the other (hereinafter referred to as APC_L) is set to a light amount as low as possible.

FIG. 13 is a diagram showing characteristics of the laser diode of the conventional laser drive device.

Referring to FIG. 13, the characteristics of the laser diode (relationship between the drive current and the light amount) are indicated by a curve A, and the threshold current is represented by Ith. In this case, when the laser diode is influenced by bias light emission of the other light emitting element(s), the threshold current deviates from Ith by $\Delta$Ith, and the characteristic curve indicative of the characteristics of the laser diode is changed to a curve B.

SUMMARY OF THE INVENTION

The present invention provides a laser drive device that is capable of easily reducing influence of bias light emission and thereby preventing a threshold current from varying, a method of controlling the same, and a storage medium.

In a first aspect of the present invention, there is provided a laser drive device that drives a laser diode, comprising a detection unit configured to detect a light amount of a laser beam output from the laser diode, a light amount control unit configured to control the light amount of the laser beam output from the laser diode to a plurality of set light amounts by controlling a drive current supplied to the laser diode according to a detection output from the detection unit, a threshold current calculation unit configured to calculate a threshold current immediately before the laser diode starts stimulated light emission, according to the detection output from the detection unit and a drive current supplied to the laser diode, and a control unit configured to switch and select the plurality of set light amounts, compare a plurality of threshold currents with each other which are obtained from the threshold current calculation unit with respect to the plurality of set light amounts, respectively, and determine a set light amount corresponding to a difference, in threshold current, which is not less than a predetermined value, as a set light amount for use in light amount control of the laser diode.

In a second aspect of the present invention, there is provided a laser drive device that drives a laser diode, comprising a detection unit configured to detect a light amount of a laser beam output from the laser diode, a light amount control unit configured to control the light amount of the laser beam output from the laser diode to a plurality of set light amounts by controlling a drive current supplied to the laser diode according to a detection output from the detection unit, and a control unit configured to switch and select the plurality of set light amounts, calculate a change ratio with respect to each of the plurality of set light amounts, the change ratio being indicative of a ratio of change in relationship between the light amount and the drive current which is determined by the detection output from the detection unit and the drive current, and determine a set light amount corresponding to a change ratio not less than a predetermined change ratio, as a set light amount for use in light amount control of the laser diode.

In a third aspect of the present invention, there is provided a method of controlling a laser drive device that drives a laser diode, comprising detecting a light amount of the laser beam output from the laser diode, using a detection unit, controlling the light amount of the laser beam output from the laser diode to a plurality of set light amounts by controlling a drive current supplied to the laser diode according to a detection output from the detection unit, calculating a threshold current immediately before the laser diode starts stimulated light emission, according to the detection output from the detection unit and a drive current supplied to the laser diode, and switching and selecting the plurality of set light amounts, comparing a plurality of threshold currents with each other which are obtained from said calculating the threshold current with respect to the plurality of set light amounts, respectively, and determining a set light amount corresponding to a difference, in threshold current, which is not less than a predetermined value, as a set light amount for use in light amount control of the laser diode.

In a fourth aspect of the present invention, there is provided a method of controlling a laser drive device that drives a laser diode, comprising detecting a light amount of a laser beam output from the laser diode, using a detection unit, controlling the light amount of the laser beam output from the laser diode to a plurality of set light amounts by controlling a drive current supplied to the laser diode according to a detection output from the detection unit, and switching and selecting the plurality of set light amounts, calculating a change ratio with respect to each of the plurality of set light amounts, the change ratio being indicative of a ratio of change in relationship between the light amount and the drive current which is determined by the detection output from the detection unit and the drive current, and determining a set light amount corresponding to a change ratio not less than a predetermined change ratio, as a set light amount for use in light amount control of the laser diode.

In a fifth aspect of the present invention, there is provided a non-transitory computer-readable storage medium storing a computer-executable control program for causing a computer to execute a method of controlling a laser drive device that drives a laser diode, wherein the method comprises detecting a light amount of the laser beam output from the laser diode, using a detection unit, controlling the light amount of the laser beam output from the laser diode to a plurality of set light amounts by controlling a drive current supplied to the laser diode according to a detection output from the detection unit, calculating a threshold current immediately before the laser diode starts stimulated light emission, according to the detection output from the detection unit and a drive current supplied to the laser diode, and switching and selecting the plurality of set light amounts, comparing a plurality of threshold currents with each other which are obtained from said calculating the threshold current with respect to the plurality of set light amounts, respectively, and determining a set light amount corresponding to a difference, in threshold current, which is not less than a predetermined value, as a set light amount for use in light amount control of the laser diode.

In a sixth aspect of the present invention, there is provided a non-transitory computer-readable storage medium storing a computer-executable control program for causing a computer to execute a method of controlling a laser drive device that drives a laser diode, wherein the method comprises detecting a light amount of a laser beam output from the laser diode, using a detection unit, controlling the light amount of the laser beam output from the laser diode to a plurality of set light amounts by controlling a drive current supplied to the laser diode according to a detection output from the detection unit, and switching and selecting the plurality of set light amounts, calculating a change ratio with respect to each of the plurality of set light amounts, the change ratio being indicative of a ratio of change in relationship between the light amount and the drive current which is determined by the detection output from the detection unit and the drive current, and determining a set light amount corresponding to a change ratio not less than a predetermined change ratio, as a set light amount for use in light amount control of the laser diode.

According to the present invention, it is possible to reduce the influence of bias light emission and thereby prevent the threshold current from varying, by a simple circuit configuration without complicating a control sequence.

Further features of the present invention will become apparent from the following description of exemplary embodiments (with reference to the attached drawings).

BRIEF DESCRIPTION OF THE DRAWINGS

FIG. 5 is a table useful in explaining operation modes of a current controller and a current drive section, appearing in FIG. 4.

FIG. 6 is a flowchart of a threshold current calculation process executed by the laser drive device appearing in FIG. 4 immediately after power-on.

FIG. 7 is a table of gain values of a current-voltage conversion circuit which are associated with respective gain switching signals output from a mode controller appearing in FIG. 4.

DESCRIPTION OF THE EMBODIMENTS

The present invention will now be described in detail below with reference to the accompanying drawings showing embodiments thereof.

Figure 1:
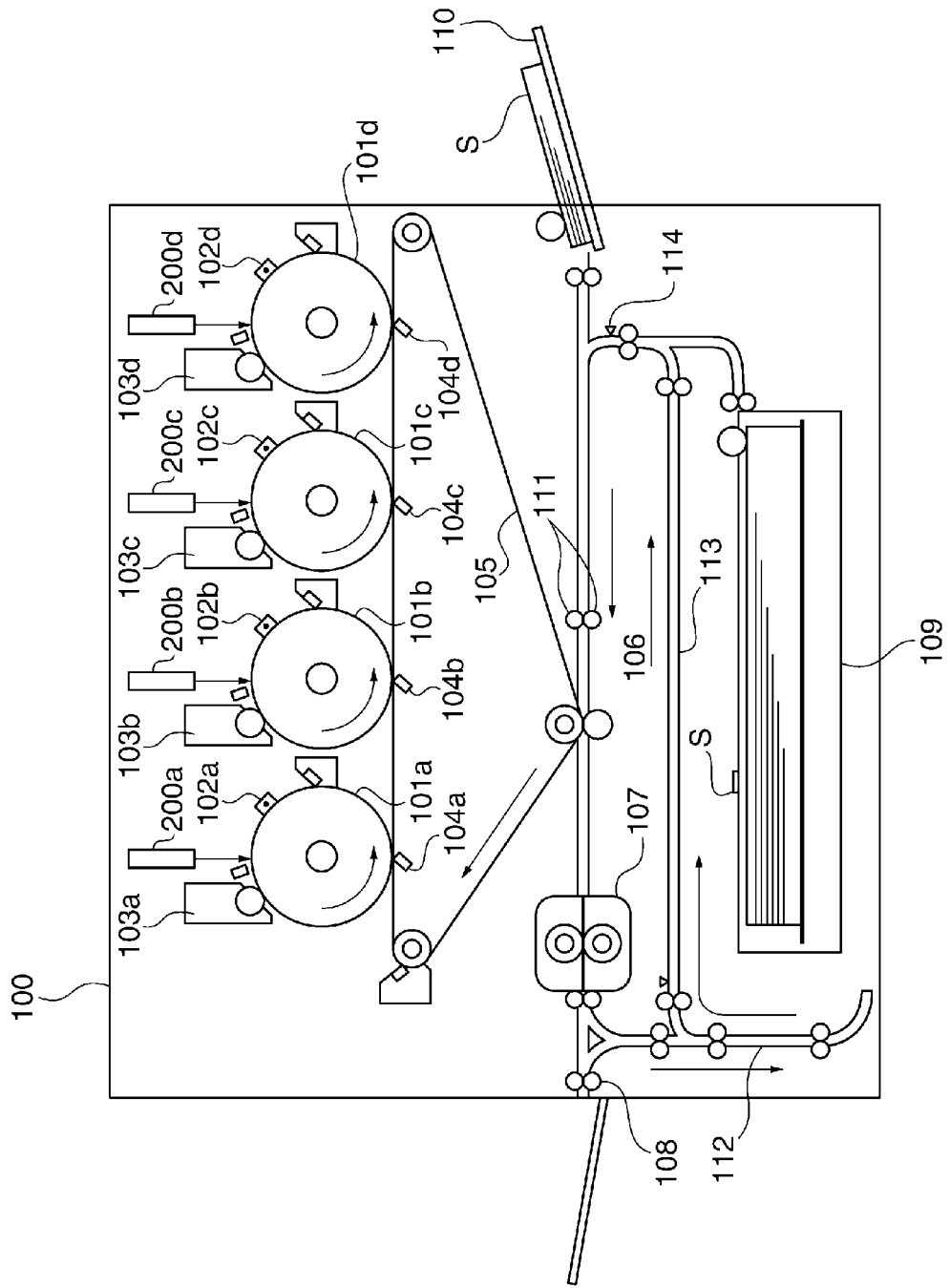
FIG. 1 is a cross-sectional view of an image forming apparatus using laser drive devices according to a first embodiment of the present invention.

FIG. 1 is a cross-sectional view of an image forming apparatus using a laser drive device according to a first embodiment of the present invention.

The illustrated image forming apparatus, denoted by reference numeral 100, is a full-color printer using a so-called electrophotographic process. When performing image formation, i.e. printing, photosensitive drums 101a to 101d which are photosensitive members associated with respective colors are charged to a predetermined potential (charging potential) by charging devices 102a to 102d, respectively. On the photosensitive drums 101a to 101d, electrostatic latent images are formed by laser lights (laser beams) emitted from light beam scanning devices 200a to 200d each having light emitting elements as light sources (e.g. semiconductor lasers), respectively. These electrostatic latent images are developed by developing devices 103a to 103d to thereby form toner images, respectively. Then, the toner images formed on the photosensitive drums 101a to 101d are transferred onto an intermediate transfer belt 105 by a transfer bias applied to transfer blades 104a to 104d.

The toner images transferred onto the intermediate transfer belt 105 form a color image, and the color image is transferred onto a recording sheet S by a secondary transfer roller 106. After that, the recording sheet S carrying the color image of toner thereon is subjected to fixing processing by a fixing device 107. After the fixing processing, the recording sheet S is discharged out of the apparatus by a discharge roller 108, etc.

The above-mentioned recording sheet S is fed from a sheet feed cassette 109, a manual feeding tray 110, or the like. Registration rollers 111 are for adjusting a timing at which the fed recording sheet S is conveyed to the secondary transfer roller 106.

When performing double-sided printing, the recording sheet S having passed through the fixing device 107 is guided into a double-sided printing inversion path 112, inverted, and conveyed in an opposite direction into a double-sided printing conveyance path 113. The recording sheet S having passed through the double-sided printing conveyance path 113 passes a vertical path roller 114 again, and has a second side thereof subjected to image formation, transfer, and fixing processing, similarly to the first side, followed by being discharged.

The above-mentioned four light beam scanning devices 200a to 200d are the same in configuration, and hence the following description is given by taking the light beam scanning device 200a as an example.

Figure 2:
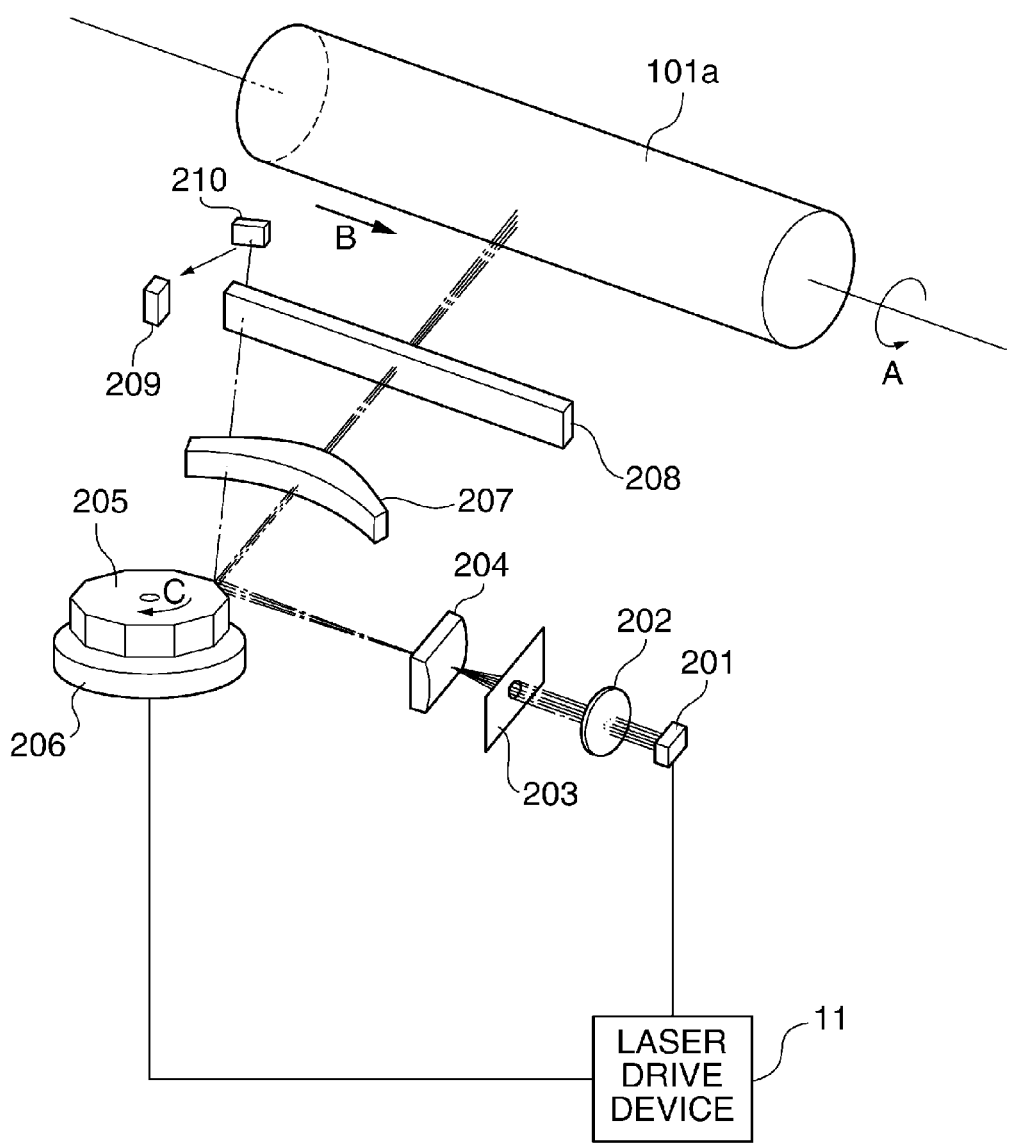
FIG. 2 is a schematic diagram of a light beam scanning device and a photosensitive drum appearing in FIG. 1.

FIG. 2 is a schematic diagram of the light beam scanning device 200a and the photosensitive drum 101a, appearing in FIG. 1.

Referring to FIG. 2, the light beam scanning device 200a includes a semiconductor laser 201 (LD: laser diode) as a light source, a collimator lens 202, an aperture diaphragm 203, a cylindrical lens 204, a polygon mirror 205, a polygon mirror drive section 206, a toric lens 207, and a diffraction optical element 208. The above-mentioned semiconductor laser 201 is driven by a laser drive device 11, described hereinafter.

The collimator lens 202 converts light beams emitted from the semiconductor laser 201 to a collimated light flux. The aperture diaphragm 203 restricts the light flux of light beams passing therethrough. The cylindrical lens 204 has a predetermined refractive power only in a sub scanning direction, and causes the light flux having passed through the aperture diaphragm 203 to form an oval image which is long in a main scanning direction, on a reflective surface of the polygon mirror 205.

The polygon mirror 205, which is a rotating polygon mirror, is rotated by the polygon mirror drive section 206 at a constant speed in a direction indicated by an arrow C in FIG. 2, and deflects (reflects) the laser beam forming the image on the reflective surface. The toric lens 207 is an optical element having f-θ characteristics, and has respective different refractive indexes in the main scanning direction and the sub scanning direction. Both of front and rear lens surfaces of the toric lens 207 extending in the main scanning direction are formed to be aspherical.

The diffraction optical element 208 is an optical element having f-θ characteristics, and has respective different magnifications in the main scanning direction and the sub scanning direction. A beam detector (BD) 209 is disposed at a location corresponding to a non-image formation area of the photosensitive drum 101a of the image forming apparatus 100, and detects a laser beam reflected by a reflective mirror 210 to thereby generate a scanning timing signal (BD signal).

On the photosensitive drum 101a, a spot of a laser beam deflected by the reflective surface of the polygon mirror 205 driven for rotation linearly moves (scans) in parallel with the axis of the photosensitive drum 101a. The light beam scanning device 200a in the present embodiment is equipped with the semiconductor laser 201 having a plurality of light emitting elements. The semiconductor laser 201 emits a plurality of laser beams to thereby make it possible to form an electrostatic latent image formed by a plurality of lines, by one scan. The photosensitive drum 101a is driven for rotation by a drive section, not shown, whereby an image writing position is moved in the sub scanning direction (rotational direction of the photosensitive drum) to repeat the main scanning.

Figure 3:
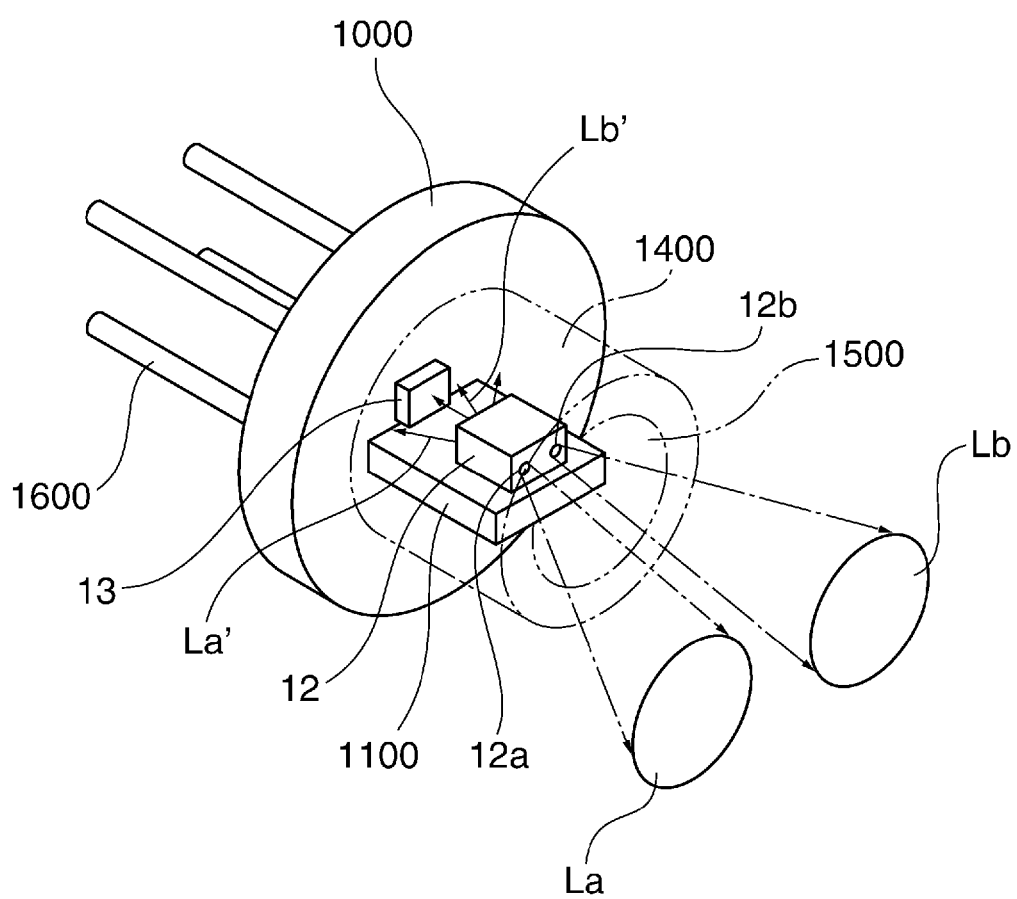
FIG. 3 is a perspective view of a semiconductor laser appearing in FIG. 2.

FIG. 3 is a perspective view of an example of the semiconductor laser appearing in FIG. 2.

Referring to FIG. 3, one of the surfaces of a stem 1000 is provided with a base 1100 on which are fixed a laser diode (LD) 12 having light emitting points 12a and 12b, and a photodiode (PD) 13 which is a light receiving section for receiving laser light (back-face laser light La', Lb'). A cap 1400 is disposed on the stem 1000 in a manner covering the base 1100 on which the LD 12 and the PD 13 are placed, and a front end face of the cap 1400 is formed with a window 1500 through which laser beams La and Lb transmit. Further, a surface on the opposite side of the stem 1000 is provided with conducting terminals 1600 for connecting the LD 12 and the PD 13 to the laser drive device 11.

Figure 4:
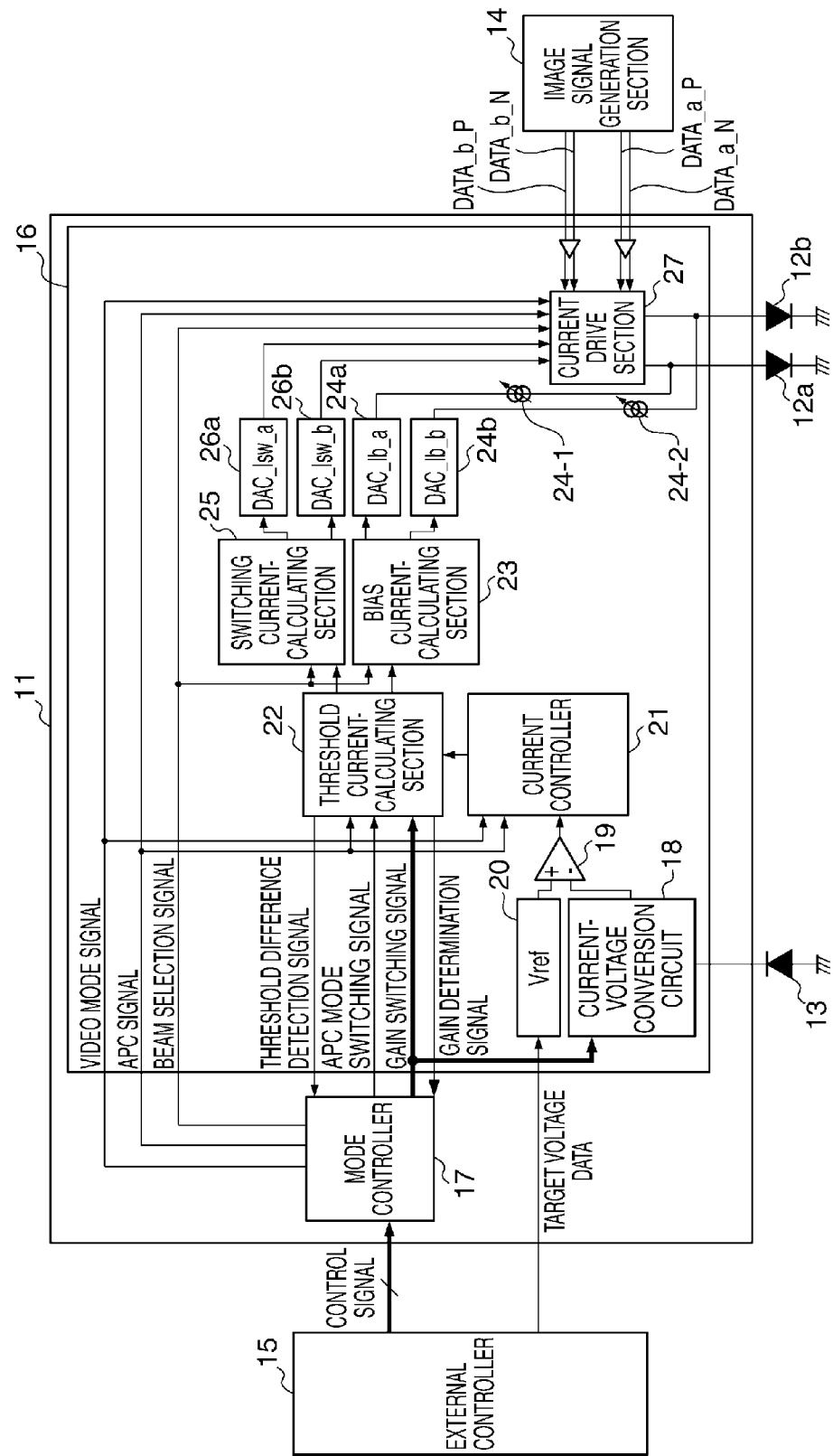
FIG. 4 is a block diagram of a laser drive device appearing in FIG. 2.

FIG. 4 is a block diagram of the laser drive device 11 appearing in FIG. 2.

Referring to FIG. 4, as mentioned above, the LD 12 includes the plurality of light emitting points 12a and 12b. In the following description, these light emitting points are also referred to as the LDs. Connected to the laser drive device 11 are not only the LDs 12a and 12b, but also the PD 13, and the laser drive device 11 drivingly controls the LDs 12a and 12b, as described hereinafter.

Further, an image signal generation section 14 and an external controller 15 are connected to the laser drive device 11. The image signal generation section 14 delivers image data provided from a controller (not shown) to the laser drive device 11 at a predetermined timing, as LD driving data signals (DATA_a_P, DATA_a_N, DATA_b_P, and DATA_b_N). Here, the LD driving data signal DATA_a_P is a data signal associated with the LD 12a, and the LD driving data signal DATA_a_N is a data signal obtained by inverting the LD driving data signal DATA_a_P. By receiving the thus inverted data signal, resistance against noise is increased. Similarly, the LD driving data signal DATA_b_P is a data signal associated with the LD 12b, and the LD driving data signal DATA_b_N is a data signal obtained by inverting the LD driving data signal DATA_b_P.

The external controller 15 provides an external control signal for controlling the laser drive device 11 to the laser drive device 11. Further, the external controller 15 sends target voltage data, referred to hereinafter, to the laser drive device 11.

The laser drive device 11 includes a laser controller 16 and a mode controller 17. The mode controller 17 controls an operation mode and a gain of the laser controller 16 according to an external control signal provided from the external controller 15, as described hereinafter. Further, the laser controller 16 controls the amount of light emitted from the LDs 12a and 12b to a target light emission amount.

The light amount of laser beams output from the LDs 12a and 12b is detected by the PD 13, and the PD 13 outputs an electric current corresponding to the light amount of the laser beams as a detected current (detected output). The detected current is supplied to a current-voltage conversion circuit 18. The current-voltage conversion circuit 18 converts the detected current to a voltage by a predetermined gain, and outputs the voltage as a PD output voltage. The gain of the current-voltage conversion circuit 18 is determined according to a gain switching signal provided from the mode controller 17.

The PD output voltage output from the current-voltage conversion circuit 18 is applied to a comparator 19. Further, a reference voltage (hereinafter referred to as Vref) output from a target voltage-setting section 20 is applied to the comparator 19. The reference voltage Vref is a voltage for determining the amount of light to be emitted from the LDs 12a and 12b, and is e.g. a voltage corresponding to an amount of light for exposing the surface of the photosensitive drum. Further, the comparator 19 compares the PD output voltage and the reference voltage Vref, and outputs a result of comparison (voltage difference) to a current controller 21.

Note that the target voltage-setting section 20 includes a DAC (digital-analog converter), not shown, and outputs the reference voltage Vref according to the target voltage data set by the external controller 15.

The current controller 21 performs a current control operation according to control signals (a video mode signal and an automatic power control (APC) signal) provided from the mode controller 17. That is, the current controller 21 controls a drive current according to a comparison result provided from the comparator 19 such that the amount of light emitted from the LDs 12a and 12b becomes equal to the target light emission amount (set light amount) (APC). The current controller 21 holds values of the drive current for driving the LDs 12a and 12b as digital data. The operation of the current controller 21 will be described hereinafter.

The current controller 21 outputs the drive current value determined by APC to a threshold current-calculating section 22. An APC signal, an APC mode-switching signal, and a gain switching signal are provided from the mode controller 17 to the threshold current-calculating section 22 as the control signals. Further, two light amounts, i.e. first and second light amounts (the higher light amount is referred to as APC_H and the lower light amount is referred to as APC_L) are specified for each of the LDs 12a and 12b and the threshold current-calculating section 22 holds these light amounts.

The threshold current-calculating section 22 calculates a threshold current Ith based on the first and second light amounts, the drive current value determined by the current controller 21, and the gain switching signal. Further, the threshold current-calculating section 22 delivers the threshold current Ith to a bias current-calculating section 23 and a switching current-calculating section 25. Note that the threshold current is an electric current immediately before the LD starts stimulated light emission. That is, the threshold current is an electric current immediately before a laser beam is output.

The bias current-calculating section 23 calculates a bias current Ib to be supplied to the LDs 12a and 12b according to the threshold current Ith. Here, the bias current is an electric current to be supplied to the LDs 12a and 12b so as to cause spontaneous light emission, which is lower than the above-mentioned threshold current, and is e.g. in a range of approximately 80% to 90% of the threshold current. That is, the bias current-calculating section 23 calculates the bias current Ib to be supplied to the LDs 12a and 12b by multiplying the threshold current Ith by a predetermined ratio.

Further, the bias current-calculating section 23 sets the bias current Ib to a DAC_Ib_a 24a and a DAC_Ib_b 24b for bias current, according to a beam selection signal provided from the mode controller 17.

The DAC_Ib_a 24a and DAC_Ib_b 24b control bias current sources 24-1 and 24-2 such that the bias current Ib is supplied to the LDs 12a and 12b. Note that the bias current is an electric current for advancing the rise time of light emission from the LD.

The switching current-calculating section 25 calculates electric currents for driving the LDs 12a and 12b (hereinafter each referred to as the switching current) according to the drive current values determined by the current controller 21 and the bias current Ib. For example, the switching current-calculating section 25 calculates the switching currents for driving the LDs 12a and 12b by subtracting the bias current Ib from the drive current values, respectively. Note that the drive current value determined by the current controller 21 is a value of a drive current for causing the LD to emit a laser beam. That is, the drive current value is a current value associated with not only the first and second light amounts, described hereinafter, but also other light amounts.

Further, the switching current-calculating section 25 sets the respective switching currents to DAC_Isw_a 26a and DAC_Isw_b 26b for switching current according to a beam selection signal provided from the mode controller 17. Then, the DAC_Isw_a 26a and the DAC_Isw_b 26b supply electric currents corresponding to the respective switching currents to a current drive section 27.

The current drive section 27 drives the LDs 12a and 12b with pulses dependent on the respective switching currents, at a timing in which image data (DATA_a_P, DATA_a_N, DATA_b_P, and DATA_b_N,) is input thereto from the image signal generation section 14, according to the control signals (a video mode signal, an APC signal, and a beam selection signal) provided from the mode controller 17.

Here, various control modes controlled by the laser drive device 11 shown in FIG. 4 will be described.

FIG. 5 is a diagram useful in explaining the operation modes of the current controller 21 and the current drive section 27, appearing in FIG. 4.

Referring to FIGS. 4 and 5, as long as only the APC signal is input from the mode controller 17, the current drive section 27 controls the LDs 12a and 12b such that light is emitted according to the switching currents set to the DAC_Isw_a 26a and the DAC_Isw_b 26b, regardless of the output from the image signal generation section 14. At this time, the current drive section 27 forcibly turns on only data associated with a laser light (beam) selected according to a beam selection signal provided from the mode controller 17, and turns off data associated with the other light beam.

Note that in the initial state, 0 is set to the DAC_Ib_a 24a and DAC_Ib_b 24b, and the DAC_Isw_a 26a and DAC_Isw_b 26b.

The laser beams emitted from the LDs 12a and 12b are received by the PD 13 for monitoring the laser beams. As mentioned hereinabove, the PD 13 outputs an electric current according to the amount of the received laser beams. The current-voltage conversion circuit 18 converts a PD output current to a PD output voltage with a gain set according to a gain switching signal provided from the mode controller 17. The comparator 19 compares the PD output voltage and the reference voltage Vref, and outputs a voltage difference to the current controller 21 as the comparison result.

The current controller 21 performs control according to the voltage difference during inputting of only the APC signal from the mode controller 17, such that the amount of light emitted from the LD 12a and 12b becomes a predetermined light amount (set light amount), in the following manner.

When the PD output voltage>Vref, i.e. when the voltage difference indicates a negative value, the current controller 21 judges that the amount of light emitted from the LDs 12a and 12b is larger than the predetermined light amount, and reduces the current value set to the DAC_Isw_a 26a and DAC_Isw_b 26b (or the DAC_Ib_a 24a and DAC_Ib_b 24b) to thereby reduce the amount of light emitted from the LDs 12a and 12b.

When the PD output voltage<Vref, i.e. when the voltage difference indicates a positive value, the current controller 21 judges that the amount of light emitted from the LDs 12a and 12b is smaller than the predetermined light amount, and increases the current value set to the DAC_Isw_a 26a and DAC_Isw_b 26b (or the DAC_Ib_a 24a and DAC_Ib_b 24b) to thereby increase the amount of light emitted from the LDs 12a and 12b.

When the PD output voltage=Vref, i.e. when the voltage difference is equal to 0, the current controller 21 judges that the amount of light emitted from the LDs 12a and 12b is equal to the predetermined light amount, and neither increases nor reduces the current value set to the DAC_Isw_a 26a and DAC_Isw_b 26b (or the DAC_Ib_a 24a and DAC_Ib_b 24b).

Note that the current controller 21 neither increases nor reduces the current value set to the DAC_Isw_a 26a and DAC_Isw_b 26b and the DAC_Ib_a 24a and DAC_Ib_b 24b also during input of only the video (VIDEO) mode signal from the mode controller 17.

The current drive section 27 is in the off mode when the VIDEO mode signal and the APC signal are simultaneously input from the mode controller 17. During the off mode, the current drive section 27 forcibly turns off data so as to turn off light emission from the LDs 12a and 12b regardless of image data provided from the image signal generation section 14. That is, during the off mode, only the bias current is supplied to the LDs 12a and 12b.

The current controller 21 is also in the off mode when the VIDEO mode signal and the APC signal are simultaneously input from the mode controller 17. During the off mode, the current controller 21 holds the current values.

The current drive section 27 is in a VIDEO mode when only the VIDEO mode signal is input from the mode controller 17. During the VIDEO mode, the current drive section 27 outputs the switching currents from the DAC_Isw_a 26a and DAC_Isw_b 26b, which are determined by the APC operation. Then, the bias current is superposed on the switching currents, and the resulting currents are supplied to the LDs 12a and 12b as the drive currents.

The current controller 21 holds the current values during input of only the VIDEO mode signal from the mode controller 17.

The current controller 21 is in a discharge mode when neither the APC signal nor the VIDEO mode signal is input from the mode controller 17. In the discharge mode, the current controller 21 initializes the current values to thereby initialize the current values set to the DAC_Isw_a 26a and DAC_Isw_b 26b, and DAC_Ib_a 24a and DAC_Ib_b 24b. When both of the APC signal and the VIDEO mode signal ceases to be input, the current drive section 27 forcibly turns off data.

Next, a description will be given of a bias current determination process executed by the laser drive device 11 appearing in FIG. 4.

In the first embodiment, it is determined, based on a comparison of values of the threshold current Ith calculated by the threshold current-calculating section 22, whether or not the lower light amount (APC_L) of the light amounts used for calculation of the threshold current Ith is influenced by the amount of bias light emission of the other beam. To this end, first, immediately after power-on, a threshold current of one LD is calculated in a state in which the bias current is not supplied to the other LD, and the calculated threshold current is set as Ith0.

Next, a threshold current of the one LD is calculated in a state in which a bias current which is lower than the above-mentioned threshold current and is e.g. in a range of approximately 80% to 90% of the above-mentioned threshold current Ith0, is supplied to the other LD that emits a laser beam, and the calculated threshold current is set as Ith1. If a difference between the threshold currents Ith0 and Ith1 is less than a predetermined value, it is determined that the threshold current is calculated without being influenced by the bias light emission of the other beam. Further, to accurately calculate the threshold current, the APC_L light amount is reduced.

Then, the above-described calculation is repeated, and if a difference between the threshold currents Ith0 and Ithn (n represents an integer of 1 or more) is not less than the predetermined value, the threshold current-calculating section 22 determines that the APC_L light amount is influenced by the bias light emission of the other beams. Then, the threshold current-calculating section 22 calculates the threshold current using the lowest APC_L light amount which is not influenced by the bias light emission of the other beam.

Figure 6:
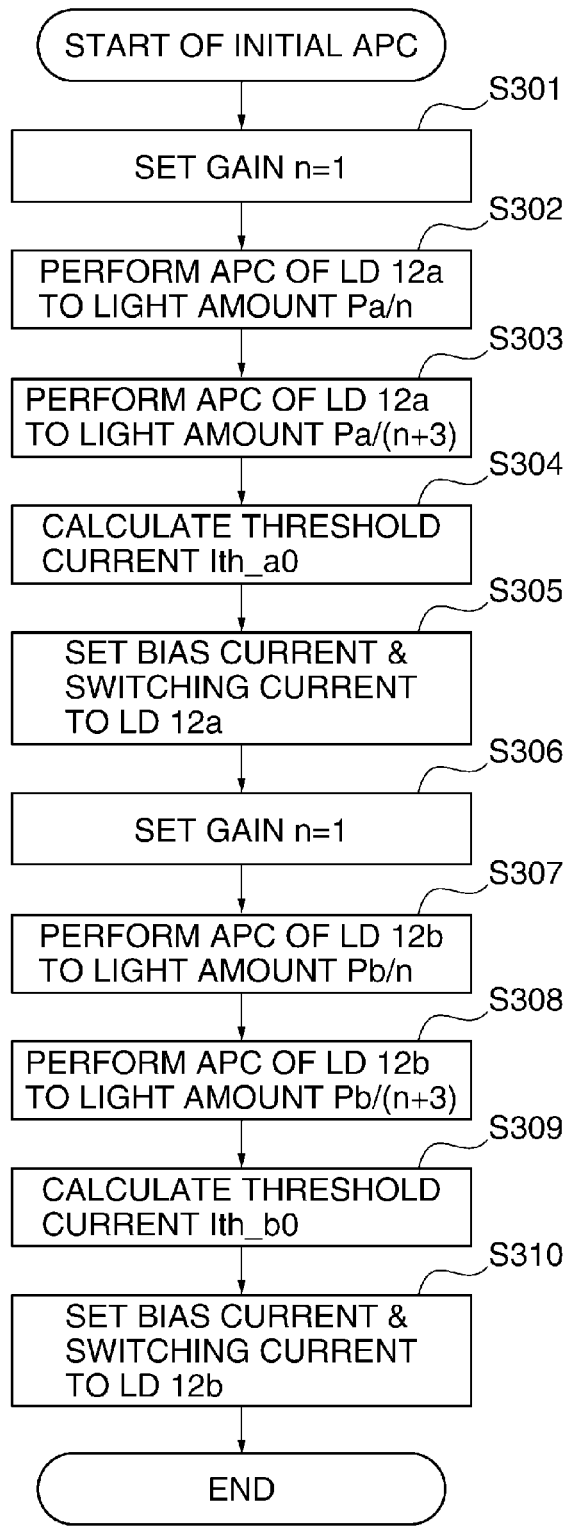

FIG. 6 is a flowchart of a threshold current calculation process executed by the laser drive device 11 appearing in FIG. 4 immediately after power-on. FIG. 7 is a table of values of the gain of the current-voltage conversion circuit 18, associated with gain switching signals output from the mode controller 17 appearing in FIG. 4.

Referring to FIGS. 4, 6, and 7, the laser drive device 11 executes the calculation process shown in FIG. 6 during input of the initial APC signal from the external controller 15 immediately after power-on.

First, the mode controller 17 outputs a gain switching signal for changing the gain to 1 to thereby set the gain of the current-voltage conversion circuit 18 to 1 (gain n=1: step S301). Next, the mode controller 17 outputs the APC signal and the beam selection signal to thereby forcibly cause the LD 12a to emit light. The comparator 19 compares the PD output voltage obtained by converting the PD output current to the voltage using the gain of 1 by the current-voltage conversion circuit 18, with the reference voltage Vref, and outputs the comparison result. The current controller 21 performs the APC operation according to the comparison result to thereby control the LD 12a to a predetermined light amount (step S302). The light amount at this time is set as Pa, and a current value Iai1 of electric supplied at this time is stored in an internal memory (not shown) of the threshold current-calculating section 22.

Next, the mode controller 17 outputs both of the APC signal and the VIDEO mode signal, and forcibly turns off light emission from the LD 12a.

Then, the mode controller 17 outputs a gain switching signal for changing the gain to 4 to thereby set the gain of the current-voltage conversion circuit 18 to 4 so as to perform light amount detection by causing the LD 12a to emit light with a light amount Pa/4. Next, the mode controller 17 outputs the APC signal and the beam selection signal to thereby forcibly cause the LD 12a to emit light. The comparator 19 outputs a result of comparison between the PD output voltage obtained by converting the PD output current to the voltage using the gain of 4 by the current-voltage conversion circuit 18, and the reference voltage Vref. The current controller 21 performs the APC operation according to the output comparison result to thereby control the LD 12a to the light amount Pa/4 (step S303). A current value Iai4 of electric current supplied at this time is stored in the internal memory of the threshold current-calculating section 22.

Then, the threshold current-calculating section 22 calculates a threshold current Ith_a0 according to the light amounts Pa and Pa/4, and the current values Iai1 and Iai4 corresponding to these light amounts, and stores the threshold current Ith_a0 in the internal memory thereof (step S304).

The bias current-calculating section 23 and the switching current-calculating section 25 calculate a bias current and a switching current, respectively, based on the threshold current Ith_a0 and the current value Iai1. Then, the bias current-calculating section 23 and the switching current-calculating section 25 sets the calculated bias current and switching current to the DAC_Isw_a 26a and the DAC_Ib_a 24a, respectively (step S305).

Next, the mode controller 17 outputs a gain switching signal for changing the gain to 1 to thereby set the gain of the current-voltage conversion circuit 18 to 1 (step S306). Next, the mode controller 17 outputs the APC signal and the beam selection signal to thereby forcibly cause the LD 12b to emit light.

The comparator 19 compares the PD output voltage obtained by converting the PD output current to the voltage using the gain of 1 by the current-converting circuit 18 with the reference voltage Vref, and outputs the comparison result. The current controller 21 performs the APC operation according to the output comparison result to thereby control the LD 12b to a predetermined amount of light (step S307). The light amount at this time is set as Pb, and a current value Ibi1 of electric current supplied at this time is stored in the internal memory of the threshold current-calculating section 22.

Next, the mode controller 17 outputs both of the APC signal and the VIDEO mode signal to thereby forcibly turn off light emission from the LD 12b.

Then, the mode controller 17 outputs a gain switching signal for changing the gain to 4 to thereby set the gain of the current-voltage conversion circuit 18 to 4 so as to perform light amount detection by causing the LD 12b to emit light with a light amount Pb/4. Next, the mode controller 17 outputs the APC signal and the beam selection signal to thereby forcibly cause the LD 12b to emit light.

The comparator 19 outputs a result of comparison between the PD output voltage obtained by converting the PD output current to the voltage using the gain of 4 by the current-voltage conversion circuit 18, and the reference voltage Vref. The current controller 21 performs the APC operation according to the output comparison result to thereby control the LD 12b to the light amount Pb/4 (step S308). A current value Ibi4 of electric current supplied at this time is stored in the internal memory of the threshold current-calculating section 22.

Next, the threshold current-calculating section 22 calculates a threshold current Ith_b0 according to the light amounts Pb and Pb/4, and the current values Ibi1 and Ibi4 corresponding to these light amounts, and stores the threshold current Ith_b0 in the internal memory thereof (step S309).

The bias current-calculating section 23 and the switching current-calculating section 25 calculate a bias current and a switching current, respectively, based on the threshold current Ith_b0 and the current value Ibi1. Then, the bias current-calculating section 23 and the switching current-calculating section 25 sets the calculated bias current and switching current to the DAC_Isw_b 26b and the DAC_Ib_b 24b, respectively (step S310). Thus, the laser drive device 11 terminates the initial APC.

Note that during the initial APC, the current values set to the DAC_Isw_a 26a and the DAC_Isw_b 26b are not supplied to the LDs 12a and 12b.

Figure 8A:
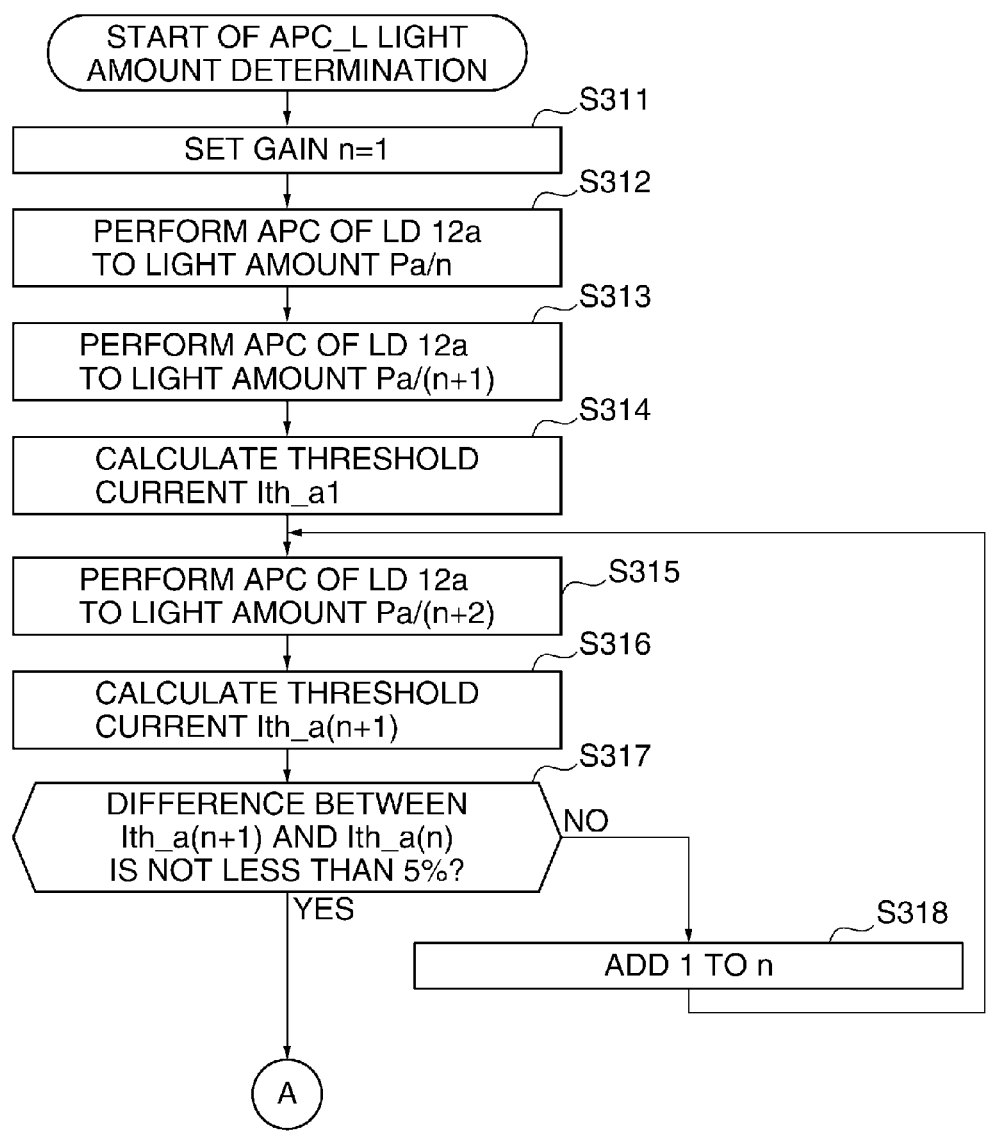
FIGS. 8A and 8B are a flowchart of an APC_L light amount determination process executed by the laser drive device appearing in FIG. 4.
Figure 8B:
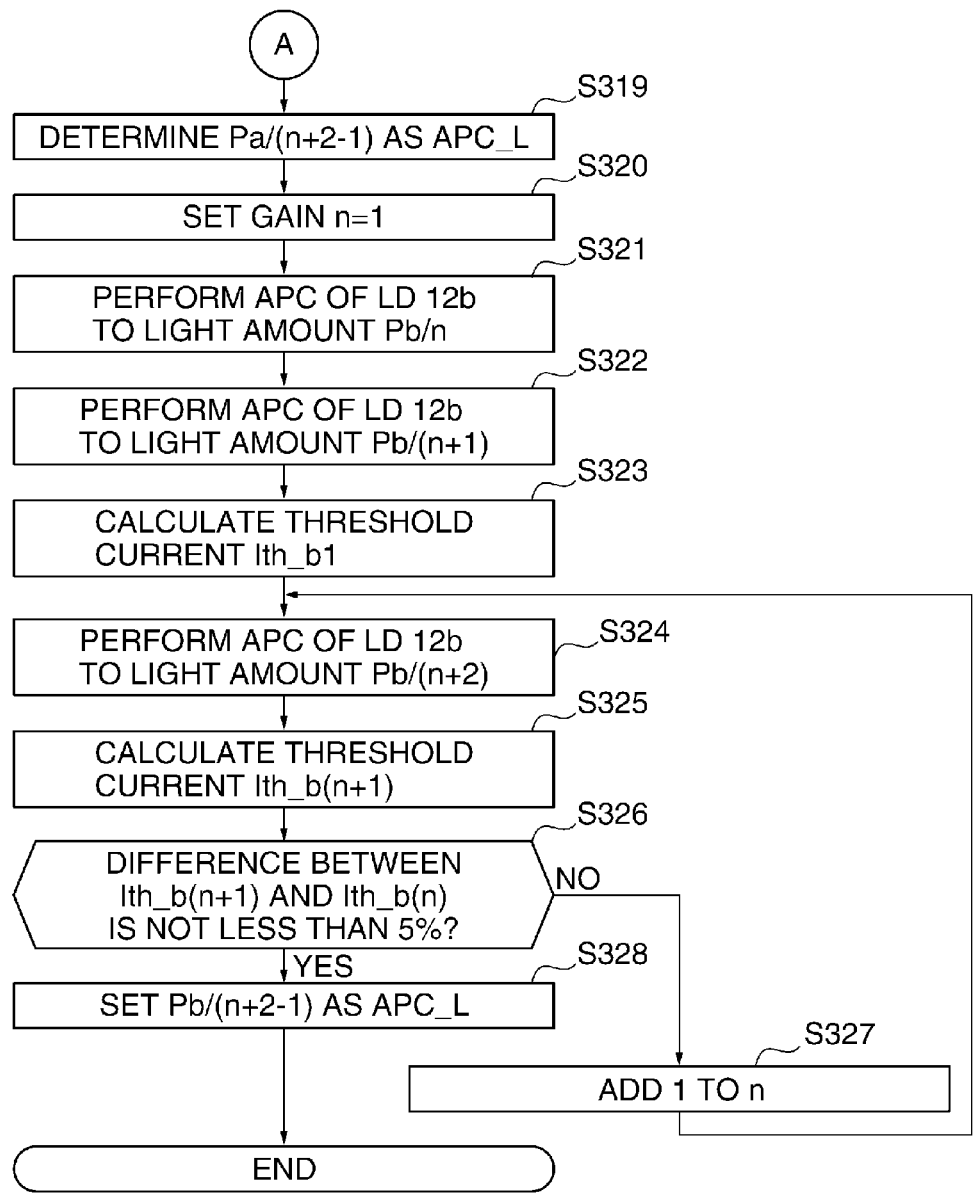

FIGS. 8A and 8B are a flowchart of an APC_L light amount determination process executed by the laser drive device 11 appearing in FIG. 4. This process is executed when the initial APC signal ceases to be output from the external controller 15.

Referring to FIGS. 4, 8A and 8B, first, the mode controller 17 outputs a gain switching signal for changing the gain to 1 to thereby set the gain of the current-voltage conversion circuit 18 to 1 (step S311). Next, the mode controller 17 outputs the APC signal and the beam selection signal to thereby forcibly cause the LD 12a to emit light. At this time, the bias current determined in the steps S306 to S310, described with reference to FIG. 6, is supplied to the LD 12b. The comparator 19 compares the PD output voltage obtained by converting the PD output current to the voltage using the gain of 1 by the current-voltage conversion circuit 18, with the reference voltage Vref, and obtains a comparison result. The current controller 21 performs the APC operation according to the comparison result to thereby control the LD 12a to a light amount Pa (step S312).

A current value Ia1 of electric current supplied at this time is stored in the internal memory of the threshold current-calculating section 22. After that, the mode controller 17 outputs both of the APC signal and the VIDEO mode signal to thereby forcibly turn off light emission from the LD 12a (off mode).

Next, the mode controller 17 outputs a gain switching signal for changing the gain to 2 to thereby set the gain of the current-voltage conversion circuit 18 to 2 so as to perform light amount detection by causing the LD 12a to emit light with a light amount Pa/2. That is, the mode controller 17 changes the set light amount to a lower one.

After that, the mode controller 17 outputs the APC signal and the beam selection signal to thereby forcibly cause the LD 12a to emit light. The current controller 21 performs the APC operation according to a comparison result output from the comparator 19 to thereby control the LD 12a to the light amount Pa/2 (step S313). A current value Ia2 of electric current supplied at this time is stored in the internal memory of the threshold current-calculating section 22.

The threshold current-calculating section 22 calculates a threshold current Ith_a1 according to the light amounts Pa and Pa/2 and the current values Ia1 and Ia2 corresponding to these light amounts (step S314).

The mode controller 17 outputs a gain switching signal for changing the gain to 3 to thereby set the gain of the current-voltage conversion circuit 18 to 3 so as to perform light amount detection by causing the LD 12a to emit light with a light amount Pa/3. After that, the mode controller 17 outputs the APC signal and the beam selection signal to thereby forcibly cause the LD 12a to emit light. The current controller 21 performs the APC operation according to a comparison result output from the comparator 19 to thereby control the LD 12a to the light amount Pa/3 (step S315). A current value Ia3 of electric current supplied at this time is stored in the internal memory of the threshold current-calculating section 22.

The threshold current-calculating section 22 calculates a threshold current Ith_a2 according to the light amounts Pa and Pa/3 and the current values Ia1 and Ia3 corresponding to these light amounts (step S316).

Then, the threshold current-calculating section 22 compares the plurality of threshold currents Ith_a1 and Ith_a2 to thereby determine whether or not a difference (absolute value) between the threshold currents Ith_a2 and Ith_a1 is not less than a predetermined ratio of change (change ratio: e.g. not less than 5%) (step S317). If the difference is less than 5% (NO to the step S317), the threshold current-calculating section 22 determines that the light amount and the electric current are in a linear relationship.

Figure 9:
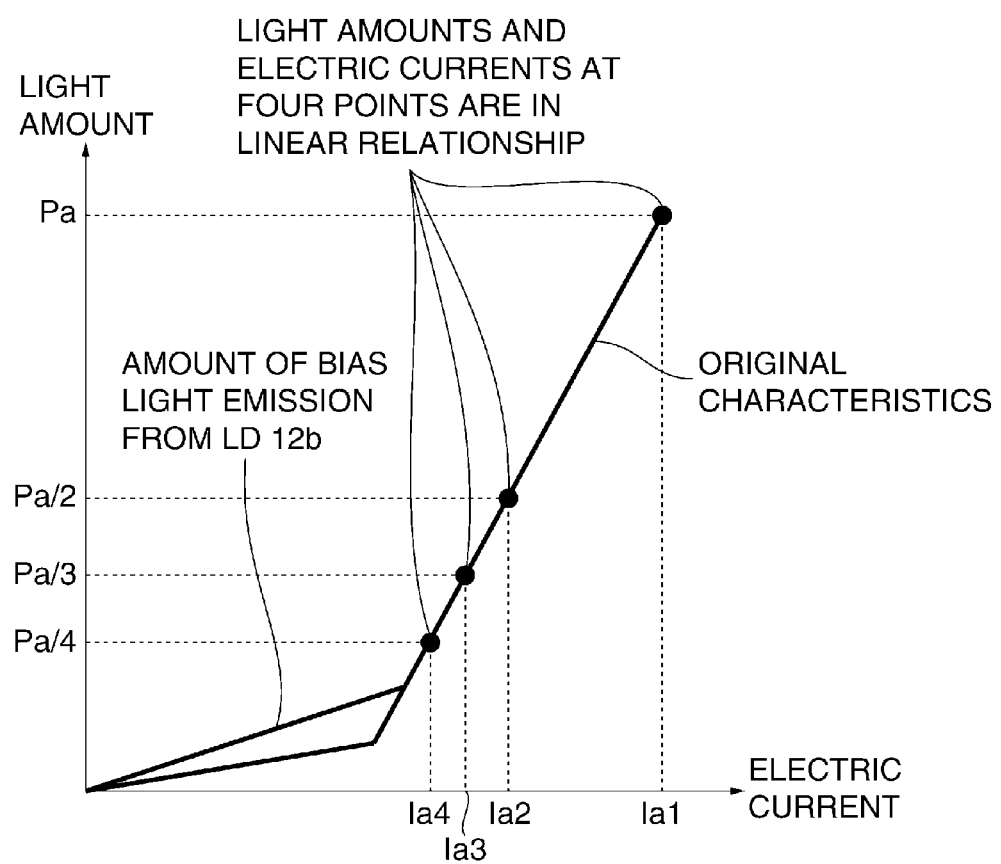
FIG. 9 is a diagram of a light amount and an electric current which have a linear relationship.

FIG. 9 is a diagram of a light amount and an electric current which have a linear relationship.

Referring to FIG. 9, the above-mentioned light amounts Pa, Pa/2, and Pa/3, and the currents Ia1, Ia2, and Ia3, associated therewith, are in a relationship in which points defined by them exist on a straight line (linear expression). If the light amounts and the currents have the relationship shown in FIG. 9, there is a possibility that an accurate threshold current can be calculated by setting the APC_L light amount to a smaller light amount.

For this reason, to control the light amount to an amount smaller than the light amount Pa/3 in the step S315, the threshold current-calculating section 22 proceeds to a step S318, and sends a gain determination signal for further adding 1 to the gain to the mode controller 17. This causes the mode controller 17 to output a gain switching signal for setting the gain to 4. Then, the steps S315 to S317 are executed. That is, APC is performed at the light amount Pa/4. The current supplied at this time is set as Ia4.

In the step S316, the threshold current-calculating section 22 calculates a threshold current Ith_a3 according to the light amounts Pa and Pa/4, and the current values Ia1 and Ia4 corresponding to these light amounts. Then, the threshold current-calculating section 22 compares the threshold currents Ith_a2 and Ith_a3 in the step S317. Thus, the above-described control is performed until the difference between the n-th threshold current Ith_a(n) and the (n−1)-th threshold current Ith_a(n−1) becomes not less than 5%.

Then, a case where the difference becomes not less than 5% (not less than a predetermined value) (YES to the step S317) will be described. Now, the following description is given assuming that the difference between the threshold currents Ith_a3 and Ith_a4 is not less than 5%.

Figure 10:
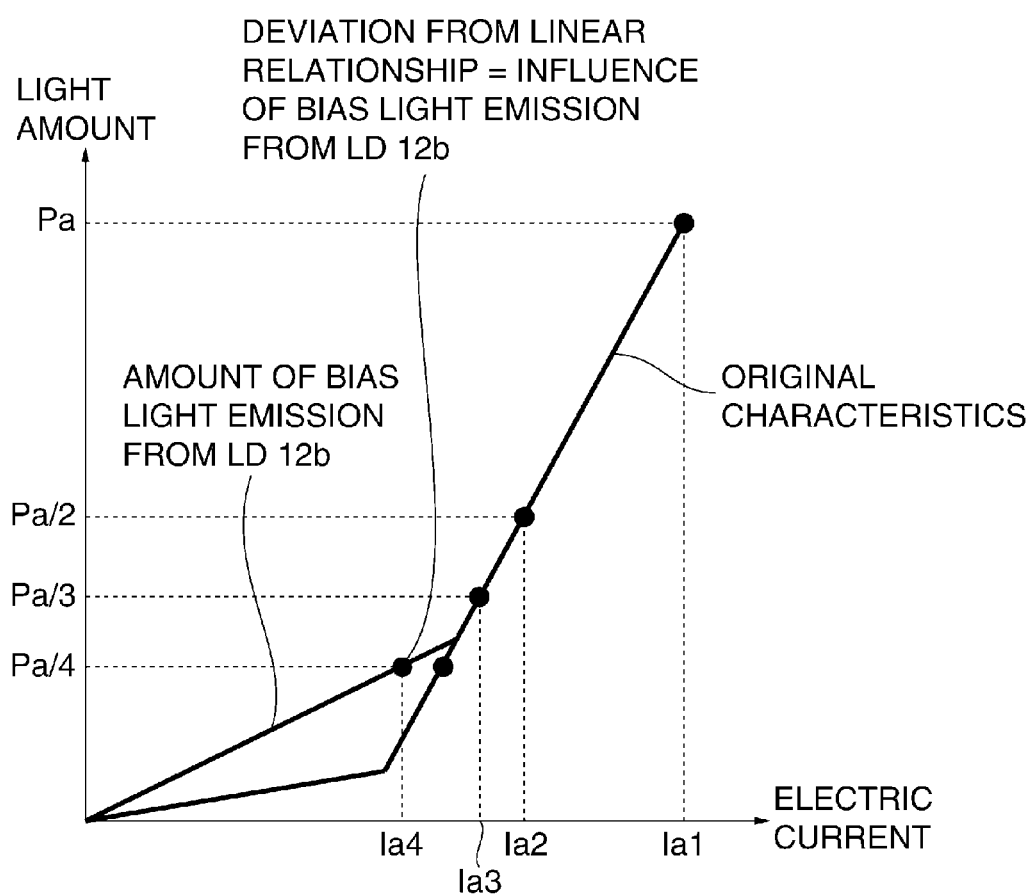
FIG. 10 is a diagram of a light amount and an electric current which do not have a linear relationship.

FIG. 10 is a diagram of a light amount and an electric current which do not have a linear relationship.

Referring to FIG. 10, differently from the light amounts Pa, Pa/2, and Pa/3, the light amount Pa/4 is not located on a straight line (linear expression). This indicates that the light amount Pa/4 is influenced by the bias light emission from the LD 12b. Therefore, the threshold current-calculating section 22 sets the APC_L light amount to the lowest light amount which is not influenced by the bias light emission from the LD 12b, i.e. Pa/3, and delivers a gain determination signal indicative of a gain for emitting light with the light amount Pa/3, to the mode controller 17 (step S319).

Then, the mode controller 17 outputs a gain switching signal for changing the gain to 1, to thereby set the gain of the current-voltage conversion circuit 18 to 1 (step S320). Next, the mode controller 17 outputs the APC signal and the beam selection signal to thereby forcibly cause the LD 12b to emit light. At this time, the bias current determined in the steps S301 to S305 described with reference to FIG. 6 is supplied to the LD 12a.

The current controller 21 performs the APC operation according to a comparison result output from the comparator 19 to thereby control the LD 12b to the light amount Pb (step S321). A current value Ib1 of electric current supplied at this time is stored in the internal memory of the threshold current-calculating section 22. After that, the mode controller 17 outputs both of the APC signal and the VIDEO mode signal to thereby forcibly turn off light emission from the LD 12b (off mode).

Next, the mode controller 17 outputs a gain switching signal for changing the gain to 2 to thereby set the gain of the current-voltage conversion circuit 18 to 2 so as to cause the LD 12b to emit light with a light amount Pb/2. After that, the mode controller 17 outputs the APC signal and the beam selection signal to thereby forcibly cause the LD 12b to emit light. The current controller 21 performs the APC operation according to a comparison result output from the comparator 19 to thereby control the LD 12b to the light amount Pb/2 (step S322). A current value Ib2 of electric current supplied at this time is stored in the internal memory of the threshold current-calculating section 22.

Then, the threshold current-calculating section 22 calculates a threshold current Ith_b1 according to the light amounts Pb and Pb/2 and the currents values Ib1 and Ib2 corresponding to these light amounts (step S323).

Next, the mode controller 17 outputs a gain switching signal for changing the gain to 3 to thereby set the gain of the current-voltage conversion circuit 18 to 3 so as to cause the LD 12b to emit light with a light amount Pb/3. After that, the mode controller 17 outputs the APC signal and the beam selection signal to thereby forcibly cause the LD 12b to emit light. The current controller 21 performs the APC operation according to a comparison result output from the comparator 19 to thereby control the LD 12b to the light amount Pb/3 (step S324). A current value Ib3 of electric current supplied at this time is stored in the internal memory of the threshold current-calculating section 22.

The threshold current-calculating section 22 calculates a threshold current Ith_b2 according to the light amounts Pb and Pb/3 and the current values Ib1 and Ib3 corresponding to these light amounts (step S325).

Then, the threshold current-calculating section 22 compares the threshold currents Ith_b1 and Ith_b2 and determines whether or not a difference between the threshold currents Ith_b2 and Ith_b1 is not less than 5% (step S326).

If the difference is less than 5% (No to the step S326), the threshold current-calculating section 22 determines that the light amount and the electric current are in a linear relationship, as described with reference to FIG. 9. Therefore, the threshold current-calculating section 22 proceeds to a step S327, and sends a gain determination signal for adding 1 to the gain to the mode controller 17 so as to set the light amount to an amount smaller than the light amount Pb/3 in the step S324. As a consequence, the mode controller 17 outputs a gain switching signal for changing the gain to 4. Then, the steps S324 to S326 are executed. That is, APC is performed at the light amount Pb/4. The current supplied at this time is set as Ib4.

In the step S325, the threshold current-calculating section 22 calculates a threshold current Ith_b3 according to the light amounts Pb and Pb/4 and the current values Ib1 and Ib4 corresponding to these light amounts. Then, the threshold current-calculating section 22 compares the threshold currents Ith_b2 and Ith_b3 in the step S326. Thus, the above-described control is performed until a difference between the threshold currents Ith_b(n) and Ith_b(n−1) becomes not less than 5%.

Next, a case where the difference becomes not less than 5% will be described (YES to the step S326). Now, the following description is given assuming that the difference between the threshold currents Ith_b3 and Ith_b4 is not less than 5%.

As is clear from the description given with reference to FIG. 10, in this case, differently from the light amounts Pb, Pb/2, and Pb/3, the light amount Pb/4 is not located on a straight line (linear expression). This indicates that the light amount Pb/4 is influenced by the bias light emission from the LD 12a. Therefore, the threshold current-calculating section 22 sets the APC_L light amount to the lowest light amount which is not influenced by the bias light emission from the LD 12a, i.e. Pb/3, and outputs a gain determination signal indicative of a gain for emitting light with the light amount Pb/3 to the mode controller (step S328).

Figure 11:
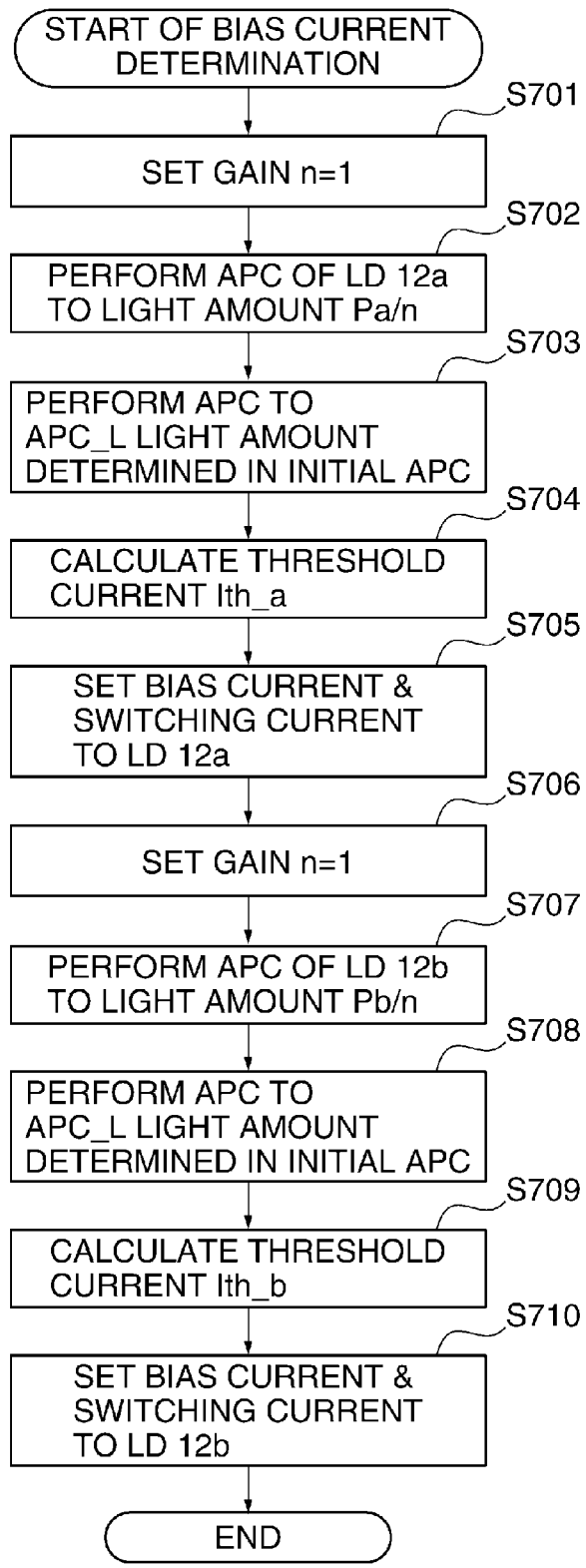
FIG. 11 is a flowchart of a bias current determination process in a normal sequence executed by the laser drive device appearing in FIG. 4.

FIG. 11 is a flowchart of a bias current determination process in a normal sequence executed by the laser drive device 11 appearing in FIG. 4. Note that in the normal sequence, the bias current is supplied to the LDs 12a and 12b.

Referring to FIGS. 4 and 11, after setting the APC_L light amount as described above, the laser drive device 11 is operated according to an APC operation signal (control signal) provided from the external controller 15.

First, the mode controller 17 outputs a gain switching signal for changing the gain to 1, to thereby set the gain of the current-voltage conversion circuit 18 to 1 (step S701). Next, the mode controller 17 outputs the APC signal and the beam selection signal to thereby forcibly cause the LD 12a to emit light. The current controller 21 performs the APC operation according to a comparison result output from the comparator 19 to thereby control the LD 12a to emit light with the light amount Pa (step S702). A current value Ian1 of electric current supplied at this time is stored in the internal memory of the threshold current-calculating section 22.

After that, the mode controller 17 outputs both of the APC signal and the VIDEO mode signal to thereby forcibly turn off light emission from the LD 12a (off mode).

Next, the mode controller 17 outputs a gain switching signal for changing the gain to the gain determined as above (determined gain) so as to cause the LD 12a to emit light with the APC_L amount Papcl determined as above. As a consequence, the gain of the current-voltage conversion circuit 18 is changed to the determined gain.

After that, the mode controller 17 outputs the APC signal and the beam selection signal to thereby forcibly cause the LD 12a to emit light. The current controller 21 performs the APC operation according to a comparison result output from the comparator 19 to thereby control the LD 12a to emit light with the light amount Papcl (step S703). A current value Iapcl_a of electric current supplied at this time is stored in the internal memory of the threshold current-calculating section 22.

The threshold current-calculating section 22 calculates a threshold current Ith a according to the light amounts Pa and Papcl_a, and the current values Ian1 and Iapcl corresponding to these light amounts (step S704).

Then, the bias current-calculating section 23 calculates a current value corresponding to the threshold current Ith_a as a bias current Iba. The switching current-calculating section 25 calculates the switching current according to the current values Iba and Ian1 (step S705).

For example, when the bias current is made equal to the threshold current, the bias current=Iba and the switching current=Ian1−Iba are set.

The switching current and bias current calculated as described above are set to the DAC_Isw_a 26a and the DAC_Ib_a 24a, respectively, whereby the bias current and the switching current associated with the LD 12a are determined.

Next, the mode controller 17 outputs a gain switching signal for changing the gain to 1, to thereby set the gain of the current-voltage conversion circuit 18 to 1 (step S706).

The mode controller 17 outputs the APC signal and the beam selection signal to thereby forcibly cause the LD 12b to emit light. The current controller 21 performs the APC operation according to a comparison result output from the comparator 19 to thereby control the LD 12b to emit light with the light amount Pb (step S707). A current value Ibn1 of electric current supplied at this time is stored in the internal memory of the threshold current-calculating section 22. After that, the mode controller 17 outputs both of the APC signal and the VIDEO mode signal to thereby forcibly turn off light emission from the LD 12b (off mode).

The mode controller 17 outputs a gain switching signal for changing the gain to the gain determined as above to thereby set the gain of the current-voltage conversion circuit 18 to the determined gain so as to cause the LD 12b to emit light with the above-mentioned light amount Papcl. After that, the mode controller 17 outputs the APC signal and the beam selection signal to thereby forcibly cause the LD 12b to emit light. The current controller 21 performs the APC operation according to a comparison result output from the comparator 19 to thereby control the LD 12b to emit light with the light amount Papcl (step S708). A current value Iapcl_b of electric current supplied at this time is stored in the internal memory of the threshold current-calculating section 22.

Next, the threshold current-calculating section 22 calculates a threshold current Ith_b according to the light amounts Pb and Papcl, and the current values Ibn1 and Iapcl_b corresponding to these light amounts (step S709). Then, the bias current-calculating section 23 calculates a current value corresponding to the threshold current Ith_b as a bias current (Ibb), and sets the calculated bias current to the DAC_Ib_b 24b. The switching current-calculating section 25 calculates a switching current according to the bias current Ibb and the current value Ibn1, and sets the calculated switching current to the DAC_Isw_b 26b (step S710). This terminates the bias current determination process of the laser drive device 11.

As described above, in the first embodiment, when calculating a value of the bias current based on the current values of each LD for each of the multiple beams each set to two light amounts, it is possible to set the lower one of the two light amounts to a light amount as low as possible without being influenced by the bias light emission amount of the other beam, whereby it is possible to supply an accurate bias current to each LD.

Next, a description will be given of a laser drive device according to a second embodiment of the present invention. The laser drive device according to the second embodiment is the same in hardware configuration as the laser drive device shown in FIG. 4.

Although in the above-described first embodiment, the light amount Papcl which is not influenced by the bias light emission of the other beam is determined based on a difference between two adjacent values of sequentially calculated values of the threshold current Ith, in the laser drive device according to the second embodiment, slopes of linear expressions are determined which are defined based on the light amounts Pb and Pbn (n represents an integer not less than 1) and the current values Ib1 and Ibn corresponding to these light amounts. Then, a comparison is made between these slopes to determine whether or not the light amount is influenced by the bias light emission e.g. from the LD 12a.

Figure 12:
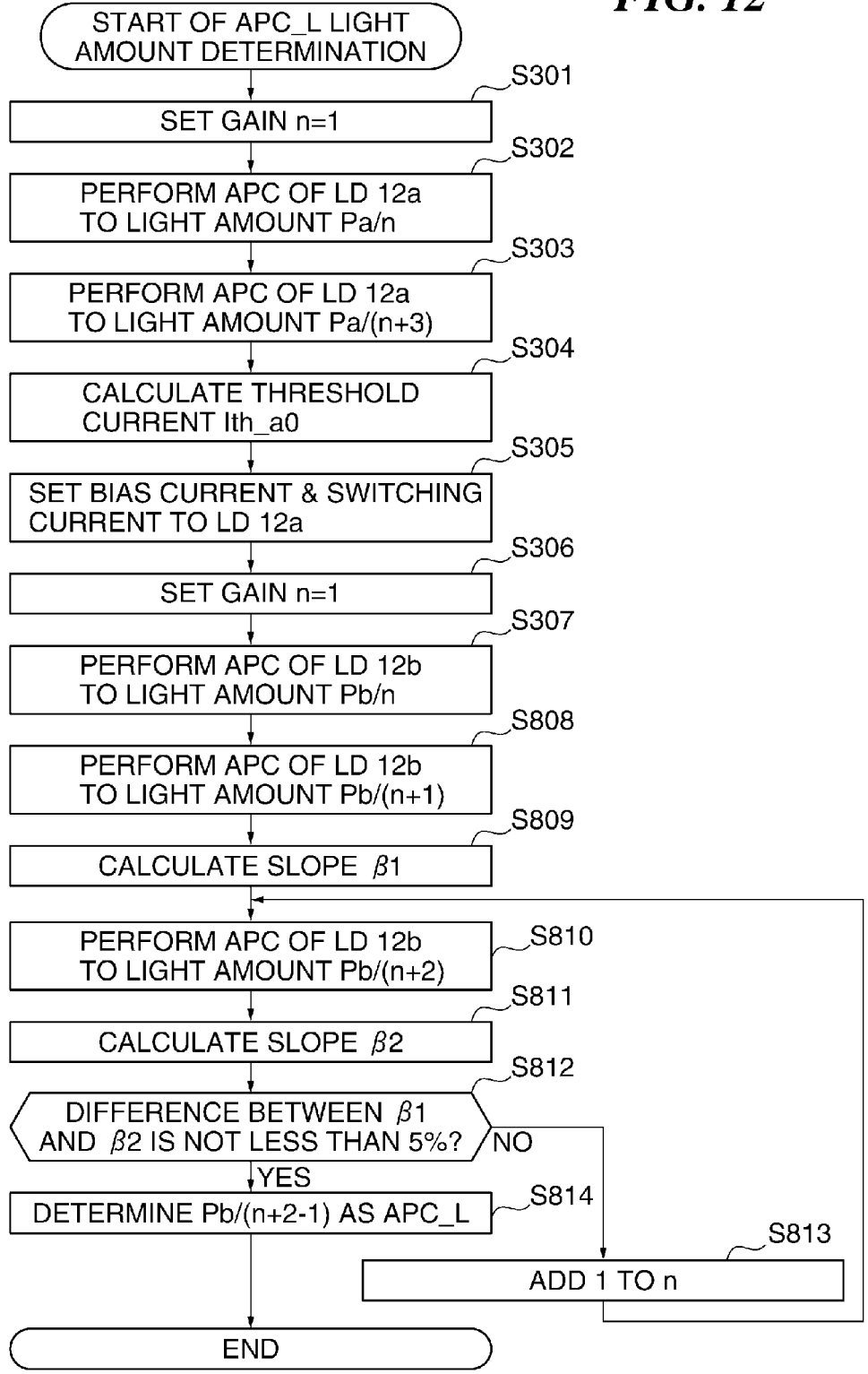
FIG. 12 is a flowchart of an APC_L light amount determination process executed by a laser drive device according to a second embodiment of the present invention.
Figure 13:
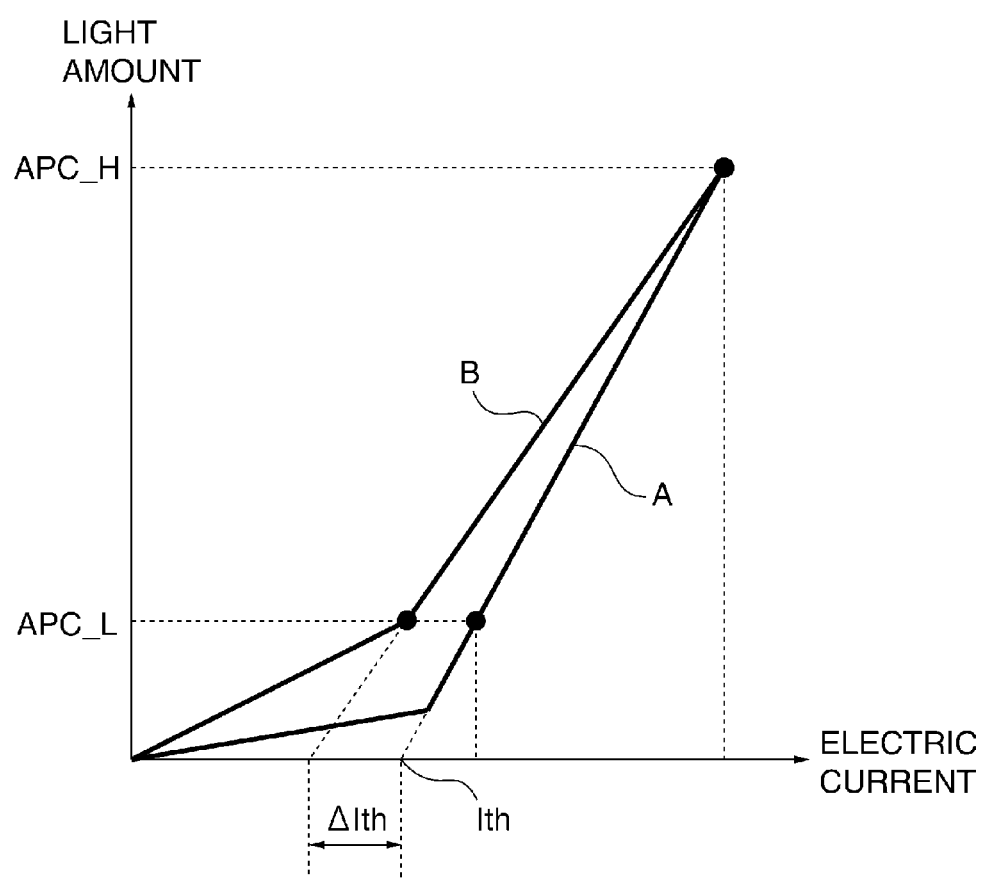
FIG. 13 is a diagram showing characteristics of a laser diode of a conventional laser drive device.

FIG. 12 is a flowchart of an APC_L light amount determination process executed by the laser drive device 11 according to the second embodiment immediately after power-on. Note that in the determination process shown in FIG. 12, the same steps as those in the determination process in FIG. 6 are denoted by the same step numbers, and description thereof is omitted.

After execution of the step S307 in FIG. 12, the mode controller 17 outputs a gain switching signal for changing the gain to 2 to thereby set the gain of the current-voltage conversion circuit 18 to 2 so as to cause the LD 12b to emit light with the light amount Pb/2. Next, the mode controller 17 outputs the APC signal and the beam selection signal to thereby forcibly cause the LD 12b to emit light.

The comparator 19 outputs a result of comparison between the PD output voltage obtained by converting the PD output current to the voltage using the gain of 2 by the current-voltage conversion circuit 18, and the reference voltage Vref. The current controller 21 performs the APC operation according to the result of comparison to thereby control the LD 12b to the light amount Pb/2 (step S808). A current value Ib2 supplied at this time is stored in the internal memory of the threshold current-calculating section 22.

Next, the threshold current-calculating section 22 calculates a slope $\beta 1$ of the linear expression (straight line) based on the light amounts Pb and Pb/2 and the current values Ib1 and Ib2 corresponding to these light amounts (step S809).

The mode controller 17 outputs a gain switching signal for changing the gain to 3 to thereby set the gain of the current-voltage conversion circuit 18 to 3. Then, the current controller 21 performs the APC operation as described above to thereby control the LD 12b to the light amount Pb/3 (step S810). The threshold current-calculating section 22 calculates a slope $\beta 2$ of the linear expression based on the light amounts Pb and Pb/3 and the current values Ib1 and Ib3 corresponding to these light amounts (step S811).

The threshold current-calculating section 22 compares the slopes $\beta 1$ and $\beta 2$ to determine whether or not a difference (absolute value) between the slopes $\beta 1$ and $\beta 2$ is not less than a predetermined value (e.g. 5%) (step S812). If the difference is less than 5% (NO to the step S812), the threshold current-calculating section 22 determines that the light amount and the electric current are in a linear relationship, as described hereinabove. That is, it is determined that there is a possibility that the threshold current-calculating section 22 can calculate a more accurate threshold current by setting the APC_L light amount to a lower light amount.

The threshold current-calculating section 22 notifies the mode controller 17 of this fact. As a consequence, the mode controller 17 adds 1 to the gain, and outputs a gain switching signal for changing the gain to 4 to thereby set the gain of the current-voltage conversion circuit 18 to 4 (step S813). After that, the process proceeds to the step S810, and the steps S810 to S812 are executed as described above. That is, the LD 12b is controlled to the light amount Pb/4. A current value supplied at this time is set as Ib4. Then, in the step S811, the threshold current-calculating section 22 calculates a slope $\beta 3$ based on the light amounts Pb and Pb/4 and the current values Ib1 and Ib4 corresponding to these light amounts. In the step S812, the threshold current-calculating section 22 compares the slopes $\beta 2$ and $\beta 3$.

Thus, the threshold current-calculating section 22 performs the above-described operation until a difference (error) between the slopes $\beta(n)$ and $\beta(n-1)$ becomes not less than 5%.

If it is determined in the step S812 that the difference between the slopes $\beta 2$ and $\beta 1$ is not less than 5% (YES to the step S812), the threshold current-calculating section 22 determines that the light amount and the electric current are not in a linear relationship. That is, the threshold current-calculating section 22 determines that the light amount Pb/3 is influenced by the bias light emission from the LD 12a. Then, the threshold current-calculating section 22 sets the APC_L light amount to the lowest light amount which is not influenced by the bias light emission, i.e. Pb/2 (step S814). Thus, the laser drive device 11 terminates the APC_L light amount determination process.

As described above, it is possible to simplify the control by determining the APC_L light amount according to the slope of the light amount-current characteristics of the LD 12a or 12b.

As described above, in the second embodiment, when calculating, based on the current values of each LD, a value of the bias current for each of the multiple beams each set to two light amounts, it is possible to set the lower one of the two light amounts to as low a light amount as possible without being influenced by the bias light emission amount of the other beam, whereby it is possible to supply an accurate bias current to each LD. That is, according to the second embodiment, it is possible to easily reduce influence of the bias light emission to thereby prevent the threshold current from varying.

Note that in a single-beam LD as well, it is possible to calculate a threshold current based on a lower light amount, which makes it possible to improve accuracy of calculation of the threshold current.

As is clear from the above description, in FIG. 4, the PD 13 is used as a detection unit or a detection sensor. Further, the laser controller 16 and the mode controller 17 function as a light amount control unit, a threshold current calculation unit, and a control unit. Further, the laser control unit also functions as a bias current supply unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

This application claims the benefit of Japanese Patent Application No. 2013-095635 filed Apr. 30, 2013, which is hereby incorporated by reference herein in its entirety.

What is claimed is:

1. A laser drive device that drives a laser diode, comprising:
   a detection unit configured to detect a light amount of a laser beam output from the laser diode;
   a light amount control unit configured to control the light amount of the laser beam output from the laser diode to a plurality of set light amounts by controlling a drive current supplied to the laser diode according to a detection output from said detection unit;
   a threshold current calculation unit configured to calculate a threshold current according to the detection output from said detection unit and a drive current supplied to the laser diode; and
   a control unit configured to switch and select the plurality of set light amounts, compare a plurality of threshold currents with each other which are obtained from said threshold current calculation unit with respect to the plurality of set light amounts, respectively, and determine a set light amount among the plurality of set light amounts as a determined set light amount for use in light amount control of the laser diode according to whether a difference in threshold currents corresponding to the determined set light amount and another set light amount among the plurality of set light amounts is not less than a predetermined value.

2. The laser drive device according to claim 1, wherein said control unit switches the set light amount in a reducing direction, compares an n-th threshold current and an (n−1)-th threshold current (n represents an integer of 1 or more), obtained from said threshold current calculation unit, and sets a set light amount corresponding to the (n−1)-th threshold current to the determined set light amount for use in light amount control of the laser diode when a difference between the n-th and (n−1)-th threshold currents becomes not less than the predetermined value.

3. The laser drive device according to claim 1, wherein the laser diode is provided in plurality,
   the laser drive device further comprising a bias current supply unit configured to supply a bias current for advancing a rise time of light emission to each of the plurality of laser diodes, and
   wherein said control unit executes a process for determining the set light amount with respect to each of the plurality of laser diodes in a state in which the bias current is supplied thereto by said bias current supply unit.

4. A method of controlling a laser drive device that drives a laser diode, comprising:
   detecting a light amount of a laser beam output from the laser diode, using a detection unit;
   controlling the light amount of the laser beam output from the laser diode to a plurality of set light amounts by controlling a drive current supplied to the laser diode according to a detection output from the detection unit;
   calculating a threshold current according to the detection output from the detection unit and a drive current supplied to the laser diode; and
   switching and selecting the plurality of set light amounts, comparing a plurality of threshold currents with each other which are obtained from said calculating the threshold current with respect to the plurality of set light amounts, respectively, and determining a set light amount among the plurality of set light amounts as a determined set light amount for use in light amount control of the laser diode according to whether a difference in threshold currents corresponding to the determined set light amount and another set light amount among the plurality of set light amounts is not less than a predetermined value.

5. A non-transitory computer-readable storage medium storing a computer-executable control program for causing a computer to execute a method of controlling a laser drive device that drives a laser diode,
   wherein the method comprises:
   detecting a light amount of the laser beam output from the laser diode, using a detection unit;
   controlling the light amount of the laser beam output from the laser diode to a plurality of set light amounts by controlling a drive current supplied to the laser diode according to a detection output from the detection unit;
   calculating a threshold current according to the detection output from the detection unit and a drive current supplied to the laser diode; and
   switching and selecting the plurality of set light amounts, comparing a plurality of threshold currents with each other which are obtained from said calculating the threshold current with respect to the plurality of set light amounts, respectively, and determining a set light amount among the plurality of set light amounts as a determined set light amount for use in light amount control of the laser diode according to whether a difference in threshold currents corresponding to the determined set light amount and another set light amount among the plurality of set light amounts is not less than a predetermined value.

* * * * *